(12) United States Patent
Sakai et al.

(10) Patent No.: US 10,080,280 B2
(45) Date of Patent: Sep. 18, 2018

(54) RESIN MULTILAYER SUBSTRATE

(71) Applicant: Murata Manufacturing Co., Ltd., Kyoto (JP)

(72) Inventors: Norio Sakai, Kyoto (JP); Yoshihito Otsubo, Kyoto (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 0 days.

(21) Appl. No.: 15/678,422

(22) Filed: Aug. 16, 2017

(65) Prior Publication Data

US 2017/0347447 A1    Nov. 30, 2017

Related U.S. Application Data

(63) Continuation of application No. 14/330,110, filed on Jul. 14, 2014, now Pat. No. 9,769,917, which is a
(Continued)

(30) Foreign Application Priority Data

Feb. 23, 2012 (JP) ................................. 2012-037372

(51) Int. Cl.
*H05K 1/02* (2006.01)
*H05K 1/18* (2006.01)
*H05K 3/46* (2006.01)

(52) U.S. Cl.
CPC ......... *H05K 1/0278* (2013.01); *H05K 1/0298* (2013.01); *H05K 1/183* (2013.01);
(Continued)

(58) Field of Classification Search
CPC .... H05K 1/0278; H05K 1/0298; H05K 1/183; H05K 1/186; H05K 3/4691; H05K 1/0271; H05K 3/4697
(Continued)

(56) References Cited

U.S. PATENT DOCUMENTS 6,841,739 B2 * 1/2005 Moore ................. H05K 1/0212
174/255
2010/0051326 A1  3/2010 Sagisaka
(Continued)

FOREIGN PATENT DOCUMENTS

CN  102113425 A  6/2011
JP  11-330656 A  11/1999
(Continued)

OTHER PUBLICATIONS

International Search Report issued in Application No. PCT/JP2013/054128 dated Apr. 23, 2013.
(Continued)

*Primary Examiner* — Michael P McFadden
(74) *Attorney, Agent, or Firm* — Pearne & Gordon LLP (57) ABSTRACT

A resin multilayer substrate includes a resin structure formed by laminating a plurality of resin layers and disposed components. Built-in components are embedded within the resin structure and a mounted component mounted on a surface of the resin structure. The resin structure includes a flexible part in which a first lamination number of the resin layers are laminated and a rigid part in which a second lamination number of the resin layers is laminated. The second lamination number is larger than the first lamination number. When viewed in a plan view, the flexible part has a shape which is not a rectangle, and a disposed component which is closest to a boundary line between the flexible part and the rigid part is disposed such that a side thereof which is closest to the boundary line is parallel to the boundary line.

10 Claims, 9 Drawing Sheets

Related U.S. Application Data continuation of application No. PCT/JP2013/054126, filed on Feb. 20, 2013.

(52) U.S. Cl.
CPC ............ *H05K 1/186* (2013.01); *H05K 3/4691* (2013.01); *H05K 1/0271* (2013.01); *H05K 3/4697* (2013.01)

(58) Field of Classification Search
USPC ........................................................ 361/750
See application file for complete search history.

(56) References Cited

U.S. PATENT DOCUMENTS

2011/0067904 A1\* 3/2011 Aoyama .............. H05K 3/4069
174/254

2012/0275124 A1 11/2012 Pludra

FOREIGN PATENT DOCUMENTS

| | | |
|---|---|---|
| JP | 2002-009414 A | 1/2002 |
| JP | 2004-158545 A | 6/2004 |
| JP | 2007-067243 A | 3/2007 |
| JP | 2008-300889 A | 12/2008 |
| JP | 2011-023521 A | 2/2011 |
| JP | 2011-249535 A | 12/2011 |
| WO | 2010/023773 A1 | 3/2010 |

OTHER PUBLICATIONS

Written Opinion issued in Application No. PCT/JP2013/054128 dated Apr. 23, 2013.

Office Action issued in Japanese Patent Application No. 2014-500729 dated Nov. 18, 2014.

\* cited by examiner

RESIN MULTILAYER SUBSTRATE

This is a continuation of U.S. patent application Ser. No. 14/330,110 filed on Jul. 14, 2014, which is a continuation of International Application No. PCT/JP2013/054128 filed on Feb. 20, 2013 which claims priority from Japanese Patent Application No. 2012-037372 filed on Feb. 23, 2012. The contents of these applications are incorporated herein by reference in their entireties.

TECHNICAL FIELD

The present invention relates to a resin multilayer substrate.

BACKGROUND ART

An exemplary resin multilayer substrate including a rigid part and a flexible part is described in Japanese Patent Laying-Open No.2004-158545 (PTD 1). In PTD 1, a configuration in which the rigid part and the flexible part have different flexibilities is achieved by laminating a larger number of resin films in the rigid part and laminating a smaller number of resin films in the flexible part when the resin films are laminated to manufacture a multilayer substrate. In the configuration shown in PTD 1, a semiconductor element is built-in in the middle of the rigid part.

CITATION LIST

Patent Document

PTD 1: Japanese Patent Laying-Open No. 2004-158545

SUMMARY OF INVENTION

Technical Problem

The number of components built-in in a resin multilayer substrate tends to be increased, and a component may be disposed not only in the middle of a rigid part but also in the vicinity of a boundary between the rigid part and a flexible part. In that case, a bending stress generated when the flexible part is bent may concentrate on corner portions of the component, and impair the connection between the component and an electrode.

Accordingly, one object of the present invention is to provide a resin multilayer substrate capable of suppressing concentration of a bending stress generated when a flexible part is bent.

Solution to Problem

To achieve the above object, a resin multilayer substrate in accordance with the present invention includes a resin structure formed by laminating a plurality of resin layers, and one or more disposed components which are each one of a built-in component disposed to be embedded within the resin structure and a mounted component mounted on a surface of the resin structure, wherein the resin structure includes a flexible part in which a first lamination number of the resin layers are laminated, and a rigid part in which a second lamination number of the resin layers are laminated, the second lamination number being larger than the first lamination number, and, when viewed in a plan view, the flexible part has a shape which is not a rectangle, and, of the one or more disposed components, the disposed component which is closest to a boundary line between the flexible part and the rigid part is disposed such that a side thereof which is closest to the boundary line is parallel to the boundary line.

Advantageous Effects of Invention

According to the present invention, of the one or more disposed components, the disposed component which is closest to the boundary line between the flexible part and the rigid part is disposed such that a side thereof which is closest to the boundary line is parallel to the boundary line. Therefore, concentration of a bending stress, which is generated when the flexible part is bent, on corner portions of the disposed component can be suppressed.

DESCRIPTION OF EMBODIMENTS

Embodiment 1

Figure 1:
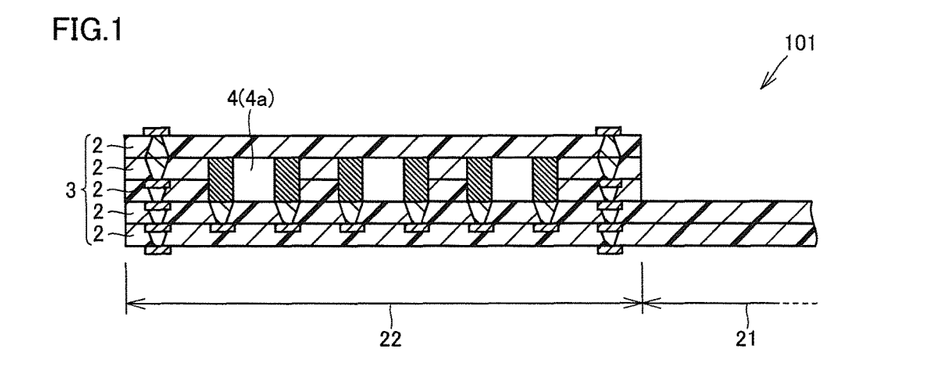
FIG. 1 is a cross sectional view of a first example of a resin multilayer substrate in Embodiment 1 in accordance with the present invention.
Figure 2:
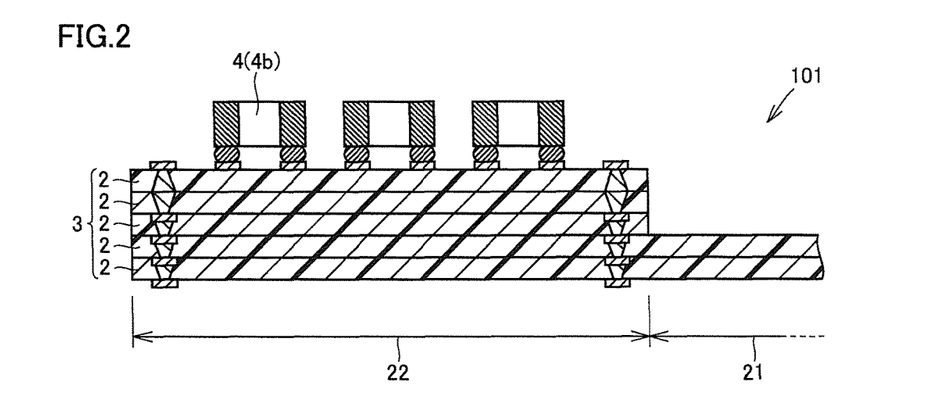
FIG. 2 is a cross sectional view of a second example of the resin multilayer substrate in Embodiment 1 in accordance with the present invention.
Figure 3:
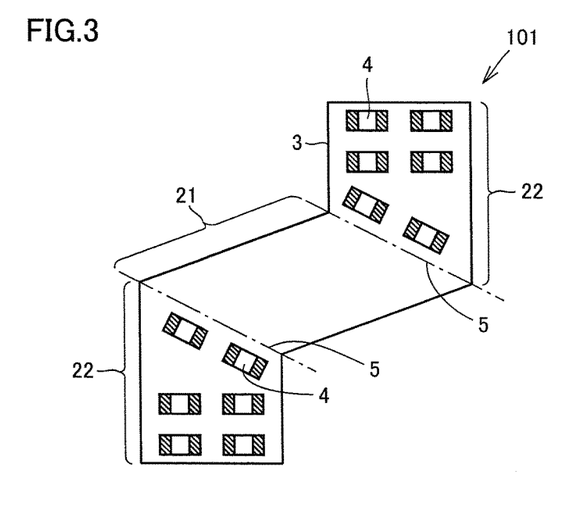
FIG. 3 is a plan view of the resin multilayer substrate in Embodiment 1 in accordance with the present invention.

A resin multilayer substrate in Embodiment 1 in accordance with the present invention will be described with reference to FIGS. 1 to 3. FIGS. 1 and 2 show two examples of disposition of components in a resin multilayer substrate 101, respectively. Resin multilayer substrate 101 includes a resin structure 3 formed by laminating a plurality of resin layers 2, and one or more disposed components 4 which are each one of a built-in component 4a disposed to be embedded within resin structure 3 and a mounted component 4b mounted on a surface of the resin structure. Disposed components 4 included in resin multilayer substrate 101 may be built-in components 4a as shown in FIG. 1, may be mounted components 4b as shown in FIG. 2, or may be a combination of the both. That is, both built-in component 4a and mounted component 4b may be included as disposed components 4. As shown in FIGS. 1 and 2 in common, resin structure 3 includes a flexible part 21 in which a first lamination number of resin layers 2 are laminated, and a rigid part 22 in which a second lamination number of resin layers 2 are laminated, the second lamination number being larger than the first lamination number. As shown in FIG. 3, when viewed in a plan view, flexible part 21 has a shape which is not a rectangle. Of one or more disposed components 4, disposed component 4 which is closest to a boundary line 5 between flexible part 21 and rigid part 22 is disposed such that a side thereof which is closest to the boundary line is parallel to boundary line 5. In FIG. 3, a total of 12 disposed components 4 are shown, and these disposed components 4 may be built-in components 4a or mounted components 4b. Of disposed components 4, built-in components 4a are shown in FIG. 3 in a see-through manner.

It is noted that, in the present embodiment, when viewed in a plan view, boundary line 5 is inclined relative to an outline of resin structure 3. The wording "inclined" used herein means neither being parallel nor perpendicular.

In the present embodiment, since disposed component 4 which is closest to boundary line 5 between flexible part 21 and rigid part 22 is disposed such that a side thereof which is closest to boundary line 5 is parallel to boundary line 5, concentration of a bending stress, which is generated when flexible part 21 is bent, on corner portions of disposed component 4 can be suppressed. As a result, the connection between disposed component 4 and a conductor connected thereto can be less likely to be impaired. Further, in some cases, it can also be expected that such a disposition produces the effect of preventing a short circuit due to a contact between the components.

In a conventional structure, when a flexible part is bent, the distance between components adjacent to each other is likely to be changed, and such a change in distance may cause performance degradation due to characteristics interference between the components arising from the influence of magnetic coupling between the components and the like. In contrast, in the present embodiment, it can also be expected that the above disposition produces the effects of suppressing a change in the distance between components adjacent to each other, and suppressing characteristics interference between the components.

Figure 4:
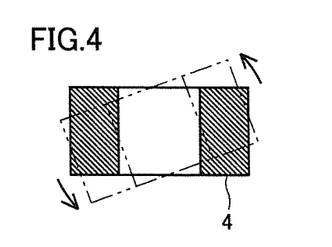
FIG. 4 is an explanatory view for θ rotation of an ordinary built-in component.

In addition, when disposed components 4 are built-in components 4a, the effect described below can also be expected. Generally, the flexible part and the rigid part have different total thicknesses, and the rigid part has a larger thickness. When attention is focused on the behavior in the vicinity of a boundary line between a flexible part and a rigid part when resin sheets are laminated and compression bonded in the conventional structure, a larger amount of resin flows in the rigid part, whereas a smaller amount of resin flows in the flexible part. When the amounts and orientations of resin respectively flowing from the rigid part and the flexible part to a component disposed in the vicinity of the boundary line are unbalanced, a built-in component is likely to make so-called θ rotation. "θ rotation" means that a built-in component rotates in a plane parallel to the resin sheets while staying at the same location, as shown in FIG. 4. FIG. 4 shows one built-in component viewed in a plan view. Originally, there is a clearance designed as a mounting margin around the built-in component. The resin flows into the clearance portion from the circumference at the time of batch lamination. If the built-in component is not disposed to be parallel to the boundary line on this occasion, the resin flows not uniformly, and the built-in component is likely to make θ rotation or to be displaced. As a result, reliability of the connection between the built-in component and a conductor connected thereto is decreased. However, in the present embodiment, since the built-in component is disposed to be parallel to the boundary line, the resin flow around the built-in component can be made uniform as much as possible, and thus reliability of the connection between the built-in component and a conductor connected thereto can be improved.

Figure 5:
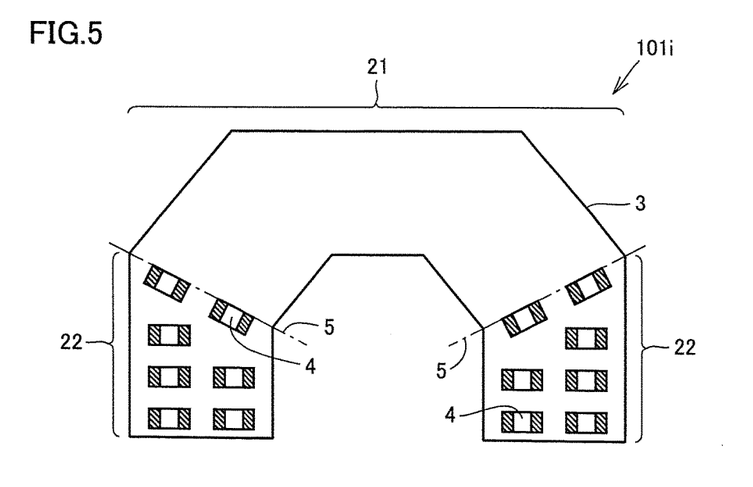
FIG. 5 is a plan view of a first variation of the resin multilayer substrate in Embodiment 1 in accordance with the present invention.
Figure 6:
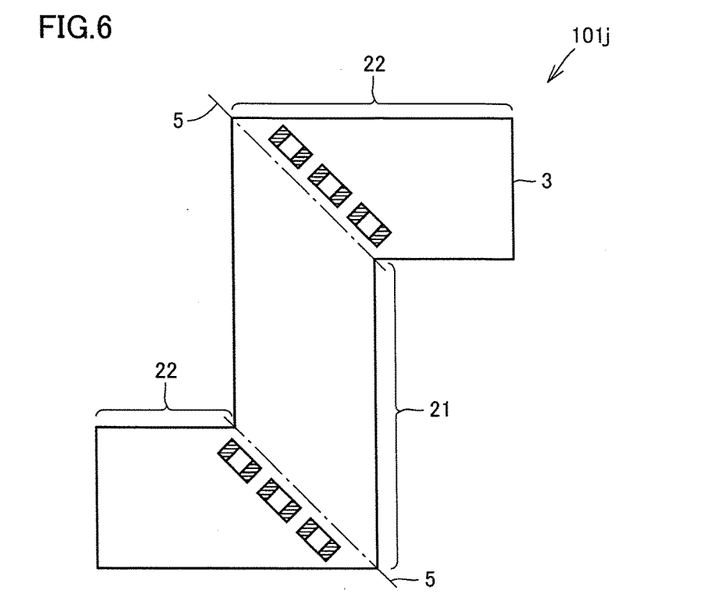
FIG. 6 is a plan view of a second variation of the resin multilayer substrate in Embodiment 1 in accordance with the present invention.

It is noted that FIG. 3 shows merely one example, and other shapes are conceivable. For example, resin multilayer substrate 101 may be a resin multilayer substrate 101*i* shown in FIG. 5, or a resin multilayer substrate 101*j* shown in FIG. 6. FIGS. 5 and 6 each shows a state viewed in a plan view. Some or all of the plurality of disposed components 4 shown in FIGS. 5 and 6 may be built-in components. For convenience of explanation, FIGS. 5 and 6 show the mounted components and the built-in components with no distinction. It may be interpreted that the built-in components are shown in a see-through manner.

Preferably, when viewed in a plan view, of one or more disposed components 4, disposed component 4 which is closest to the boundary line is a rectangle, and is disposed such that a long side of the rectangle is parallel to the boundary line, as shown in FIGS. 3, 5, and 6. Since such a configuration can avoid a torsional force from being exerted on the disposed components close to the boundary line as much as possible when the flexible part is bent, a reduction of the connectivity in these disposed components can be suppressed.

Figure 7:
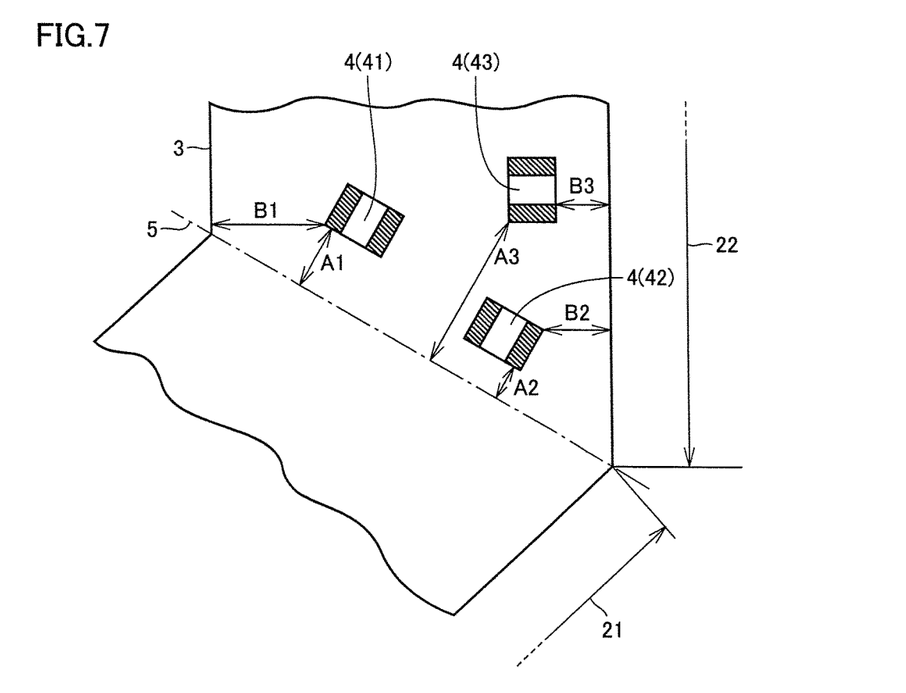
FIG. 7 is an explanatory view for positional relation of a disposed component included in the resin multilayer substrate in Embodiment 1 in accordance with the present invention.

Preferably, when viewed in a plan view, of the one or more disposed components, the disposed component whose distance to the boundary line is shorter than a distance thereof to the outline of resin structure 3 has a shape having a longitudinal direction, and is disposed such that the longitudinal direction extends along the boundary line. In the examples shown in FIGS. 3, 5, and 6, some of several disposed components 4 each corresponds to the "disposed component whose distance to the boundary line is shorter than a distance thereof to the outline of the resin structure". In order to provide a clearer illustration, a description will be given with reference to FIG. 7. In this example, disposed components 41, 42, 43 are provided as disposed components 4. In disposed component 41, a distance A1 to the boundary line is shorter than a distance B1 to the outline of resin structure 3. In disposed component 42, a distance A2 to the boundary line is shorter than a distance B2 to the outline of resin structure 3. On the other hand, in disposed component 43, a distance A3 to the boundary line is longer than a distance B3 to the outline of resin structure 3. In such a case, preferably, disposed components 41, 42 are disposed such that the longitudinal direction extends along boundary line 5, whereas disposed component 43 does not have to be disposed such that the longitudinal direction extends along boundary line 5.

By adopting this configuration, concentration of the bending stress, which is generated when the flexible part is bent, on the corner portions of disposed component 4 can be suppressed effectively, not only in the disposed component which is closest to the boundary line but also in the disposed component in the vicinity thereof.

Embodiment 2

Figure 8:
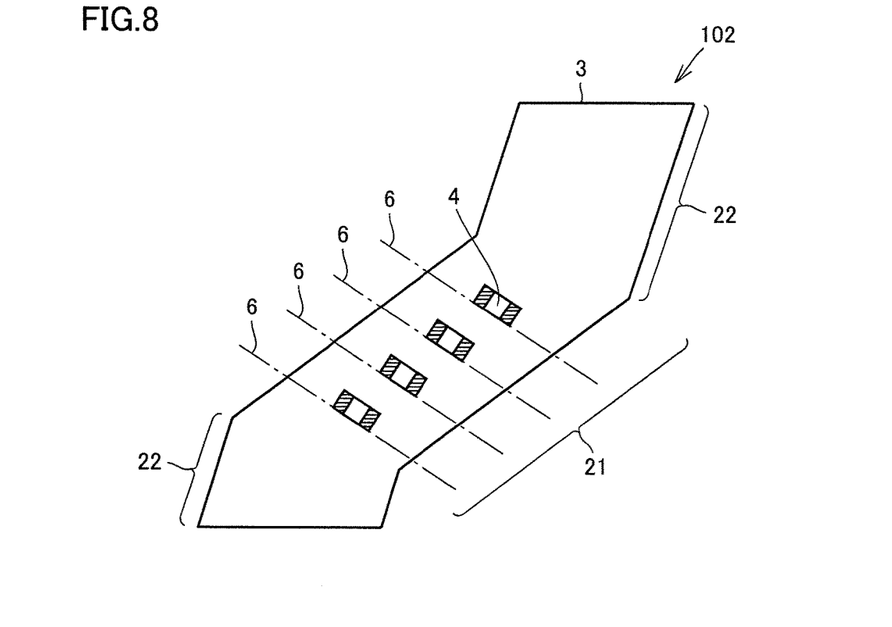
FIG. 8 is a plan view of a resin multilayer substrate in Embodiment 2 in accordance with the present invention.

A resin multilayer substrate in Embodiment 2 in accordance with the present invention will be described with reference to FIG. 8. FIG. 8 shows a resin multilayer substrate 102 viewed in a plan view. Resin multilayer substrate 102 includes flexible part 21 and rigid part 22. Resin multilayer substrate 102 includes one or more disposed components 4. At least some of disposed components 4 are disposed in flexible part 21. In the example shown in FIG. 8, four disposed components 4 are disposed in flexible part 21. Disposed components 4 may be disposed in the flexible part by being built therein or by being mounted on a surface thereof In resin multilayer substrate 102, when viewed in a plan view, of one or more disposed components 4, each of disposed components 4 disposed in flexible part 21 has a shape having a longitudinal direction, and is disposed such that the longitudinal direction extends along an axis 6 in a direction perpendicular to a bending moment generated at each position when flexible part 21 is bent.

In the present embodiment, since the longitudinal direction of disposed component 4 is disposed to extend along axis 6 in the direction perpendicular to the bending moment generated at each position when the flexible part is bent, a force bending the longitudinal direction of disposed component 4 is less likely to be exerted by bending, and as a result, the connection between disposed component 4 and an electrode can be less likely to be impaired. Further, in some cases, it can also be expected that such a disposition produces the effect of preventing a short circuit due to a contact between the components. In the present embodiment, it can also be expected that the above disposition produces the effects of suppressing a change in the distance between components adjacent to each other, and suppressing characteristics interference between the components.

Figure 9:
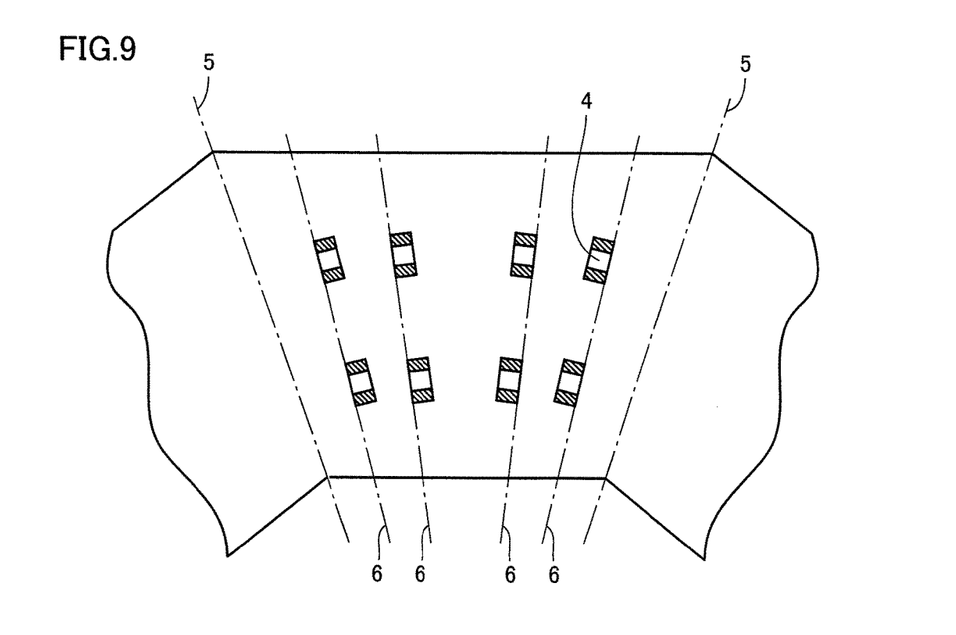
FIG. 9 is a plan view of a variation of the resin multilayer substrate in Embodiment 2 in accordance with the present invention.

It is noted that, although flexible part 21 is a parallelogram and axes 6 are parallel to each other in the example shown in FIG. 8, generally in a resin multilayer substrate including a flexible part and a rigid part, axes 6 each in the direction perpendicular to the bending moment generated at each position when the flexible part is bent are not necessarily parallel to each other. For example, when the flexible part is not a parallelogram as shown in FIG. 9, axes 6 may extend in slightly different directions, depending on the position. In the example shown in FIG. 9, the flexible part is a trapezoid. In such a case, each of disposed components 4 disposed in the flexible part is preferably disposed to be parallel to axis 6 in the direction perpendicular to the bending moment generated at each position where it is located, as shown in FIG. 9. Consequently, disposed components 4 may be disposed radially as shown in FIG. 9.

Embodiment 3

Figure 10:
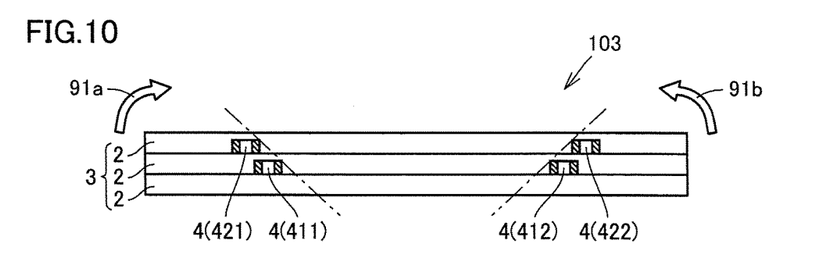
FIG. 10 is a cross sectional view of a resin multilayer substrate in Embodiment 3 in accordance with the present invention.

A resin multilayer substrate in Embodiment 3 in accordance with the present invention will be described with reference to FIG. 10. FIG. 10 shows a cross sectional view of a resin multilayer substrate 103. Although the boundary line between the rigid part and the flexible part is not clearly shown in resin multilayer substrate 103 shown in FIG. 10, parts in the vicinity of the right and left ends serve as the rigid parts, and an intermediate part sandwiched between the two rigid parts serves as the flexible part. Resin multilayer substrate 103 can be bent as indicated by arrows 91a, 91b. In resin multilayer substrate 103, one or more disposed components 4 include two disposed components 411, 412 as a first group disposed at a first height in a lamination direction, and two disposed components 421, 422 as a second group disposed at a second height different from the first height. The second height is closer to an inner circumference than the first height when the flexible part is bent. An interval between two disposed components 421, 422 as the second group is longer than an interval between two disposed components 411, 412 as the first group.

Figure 11:
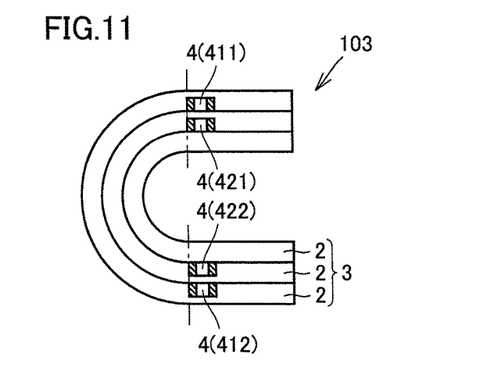
FIG. 11 is a cross sectional view of the resin multilayer substrate in Embodiment 3 in accordance with the present invention, with a flexible part thereof being bent.

In the present embodiment, by bending the flexible part as indicated by arrows 91a, 91b, a portion closer to an outer circumference is expanded in a tensioned state, and a portion closer to the inner circumference is contracted in a compressed state, which results in a state as shown in FIG. 11.

Figure 12:
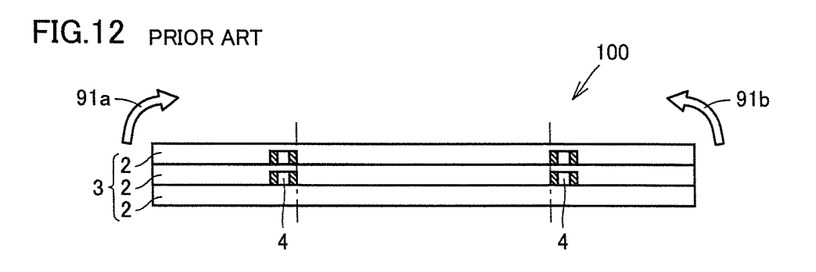
FIG. 12 is a cross sectional view of a resin multilayer substrate in accordance with a conventional technique.
Figure 13:
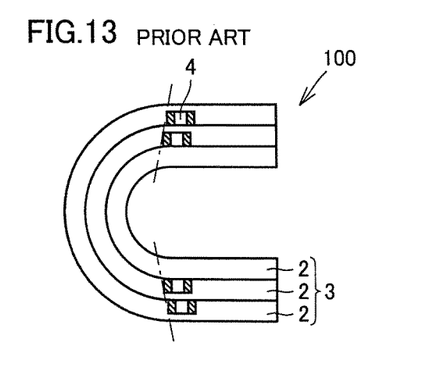
FIG. 13 is a cross sectional view of the resin multilayer substrate in accordance with the conventional technique, with a flexible part thereof being bent.

In the case of a resin multilayer substrate 100 having a conventional structure as shown for example in FIG. 12, when resin multilayer substrate 100 is bent in directions indicated by arrows 91a, 91b, a portion closer to an outer circumference is expanded in a tensioned state, and a portion closer to an inner circumference is contracted in a compressed state, which results in a state as shown in FIG. 13. Disposed components 4 which are aligned in a thickness direction in FIG. 12 are in a positional relation displaced from each other in FIG. 13. Therefore, electrical connection between the disposed components is likely to be impaired.

However, in resin multilayer substrate 103 in accordance with the present embodiment, the distances between the disposed components are set beforehand to be different from each other such that the interval between the disposed components disposed closer to the inner circumference is longer, as shown in FIG. 10. Accordingly, even if the portion closer to the inner circumference is contracted by compression, the disposed components are close to being in an aligned positional relation when resin multilayer substrate 103 is bent, as shown in FIG. 11. Therefore, electrical connection between the disposed components is less likely to be impaired.

Further, in some cases, it can also be expected that such a disposition produces the effect of preventing a short circuit due to a contact between the components. In the present embodiment, it can also be expected that the above disposition produces the effects of suppressing a change in the distance between components adjacent to each other, and suppressing characteristics interference between the components.

It is noted that, although disposed components 4 are in a bilaterally symmetric positional relation in the example shown in FIG. 10, they are not necessarily disposed to be bilaterally symmetric.

Figure 14:
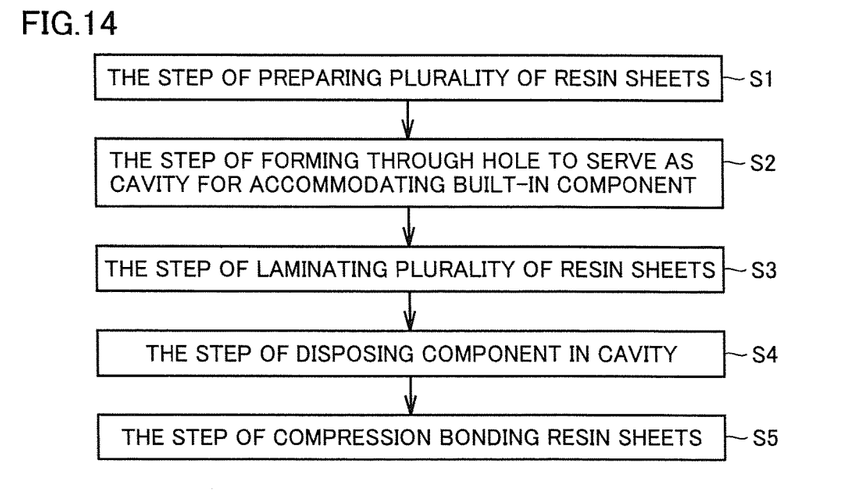
FIG. 14 is a flowchart of a method for manufacturing a resin multilayer substrate in accordance with the present invention.

A method for manufacturing a resin multilayer substrate in accordance with the present invention will be described with reference to FIGS. 14 to 25. This method for manufacturing a resin substrate having built-in components is applicable to the embodiments described above in common. FIG. 14 shows a flowchart of the method for manufacturing the resin substrate having built-in components.

Figure 15:
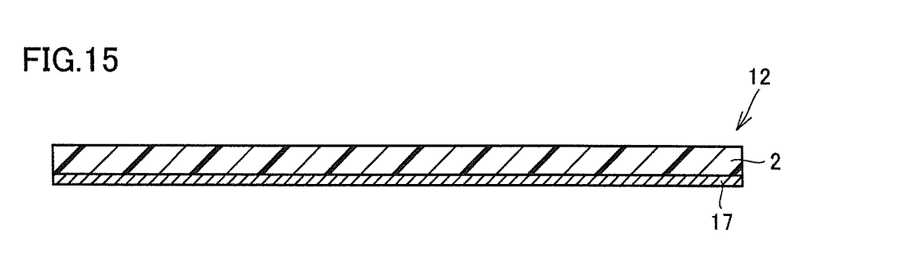
FIG. 15 is an explanatory view of a first step of the method for manufacturing the resin multilayer substrate in accordance with the present invention.

First, as step S1, a conductor foil-attached resin sheet 12 as shown in FIG. 15 is prepared. Conductor foil-attached resin sheet 12 is a sheet having a structure in which conductor foil 17 is attached to one surface of resin layer 2. Resin layer 2 is made of, for example, LCP (liquid crystal polymer) which is a thermoplastic resin. Other than LCP, the material for resin layer 2 may be PEEK (polyether ether ketone), PEI (polyetherimide), PPS (ponyphenylene sulfide), PI (polyimide), or the like. Conductor foil 17 is, for example, a 18 μm-thick foil made of Cu. Other than Cu, the material for conductor foil 17 may be Ag, Al, SUS, Ni, or Au, or may be an alloy of two or more different metals selected from these metals. Although conductor foil 17 is set to have a thickness of 18 μm in the present embodiment, conductor foil 17 may have a thickness of more than or equal to about 3 μm and less than or equal to about 40 μm. Conductor foil 17 may have any thickness which allows formation of a circuit.

In step S1 of "preparing a plurality of resin sheets," a plurality of conductor foil-attached resin sheets 12 may be prepared, or one conductor foil-attached resin sheet 12 in which regions to be cut out later individually as a plurality of resin sheets are set may be prepared.

Figure 16:
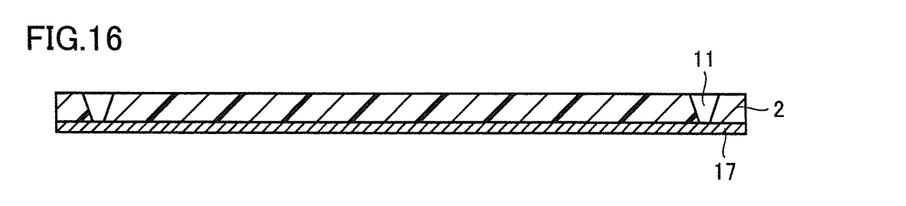
FIG. 16 is an explanatory view of a second step of the method for manufacturing the resin multilayer substrate in accordance with the present invention.

Next, as shown in FIG. 16, via holes 11 are formed to penetrate through resin layer 2 by emitting a carbon dioxide laser beam to a resin layer 2-side surface of conductor foil-attached resin sheet 12. Via holes 11 penetrate through resin layer 2, but do not penetrate through conductor foil 17. Thereafter, smears (not shown) on via holes 11 are removed. Although a carbon dioxide laser beam is used herein to form via holes 11, another type of laser beam may be used. Further, a method other than emitting a laser beam may be adopted to form via holes 11.

Figure 17:
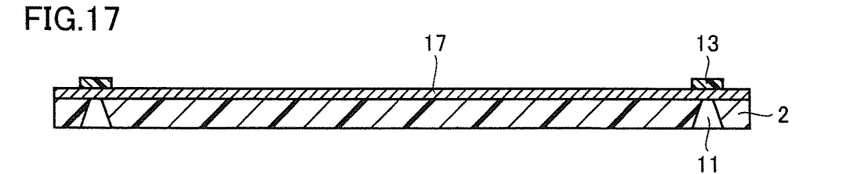
FIG. 17 is an explanatory view of a third step of the method for manufacturing the resin multilayer substrate in accordance with the present invention.

Next, as shown in FIG. 17, a resist pattern 13 corresponding to a desired circuit pattern is printed on a conductor foil 17-side surface of conductor foil-attached resin sheet 12, by a method such as filling holes with paste.

Figure 18:
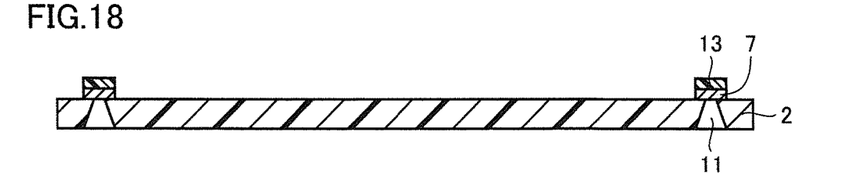
FIG. 18 is an explanatory view of a fourth step of the method for manufacturing the resin multilayer substrate in accordance with the present invention.
Figure 19:
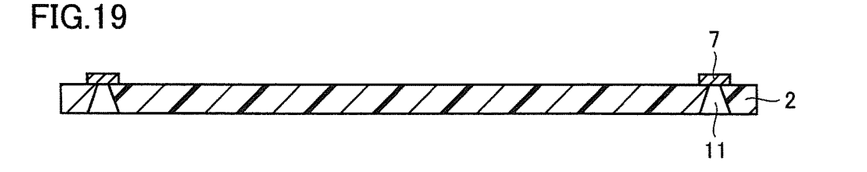
FIG. 19 is an explanatory view of a fifth step of the method for manufacturing the resin multilayer substrate in accordance with the present invention.

Next, etching is performed using resist pattern 13 as a mask, to remove a portion of conductor foil 17 not covered with resist pattern 13, as shown in FIG. 18. A portion of conductor foil 17 remaining after the etching is referred to as a "conductor pattern 7." Thereafter, resist pattern 13 is removed as shown in FIG. 19. Thereby, desired conductor pattern 7 is obtained on one surface of resin layer 2.

Figure 20:
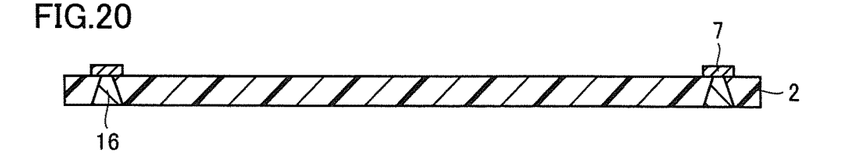
FIG. 20 is an explanatory view of a sixth step of the method for manufacturing the resin multilayer substrate in accordance with the present invention.

Next, as shown in FIG. 20, via holes 11 are filled with conductive paste by a method such as filling holes with paste. Filling holes with paste is performed from a lower surface in FIG. 20. Although via holes 11 are shown in FIGS. 19 and 20 to be in a downward attitude for convenience of explanation, filling holes with paste may be actually performed with the attitude of via holes 11 being changed as appropriate. The conductive paste which fills via holes 11 may be the one containing silver as a main component, or alternatively, may be the one containing, for example, copper as a main component. Preferably, the conductive paste contains an appropriate amount of metal powder which forms an alloy layer between itself and a metal serving as the material for conductor pattern 7 at a temperature used when the laminated resin layers are thermally compression bonded later (hereinafter referred to as a "thermal compression bonding temperature"). Since the conductive paste contains copper, i.e., Cu, as a main component for exhibiting conductivity, the conductive paste preferably contains, other than the main component, at least one of Ag, Cu, and Ni, and at least one of Sn, Bi, and Zn. Thereby, via conductors 16 are formed.

Figure 21:
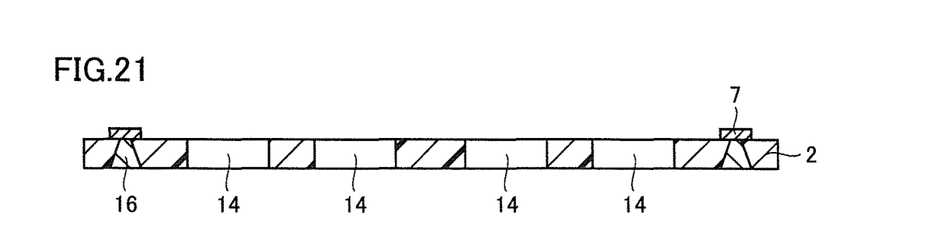
FIG. 21 is an explanatory view of a seventh step of the method for manufacturing the resin multilayer substrate in accordance with the present invention.

Next, as step S2, a through hole 14 having an area larger than the projected area of built-in component 4a is formed by punching resin layer 2, as shown in FIG. 21. The plurality of resin layers 2 to be laminated may include resin layer 2 having through hole 14 formed therein and resin layer 2 not having through hole 14 formed therein. Through hole 14 is formed in only resin layer 2 in which through hole 14 should be formed, of the plurality of resin layers 2, in accordance with the design. Although FIG. 21 shows that four through holes 14 are formed as an example, this is merely an example, and the number of through holes 14 is not limited to four.

Figure 22:
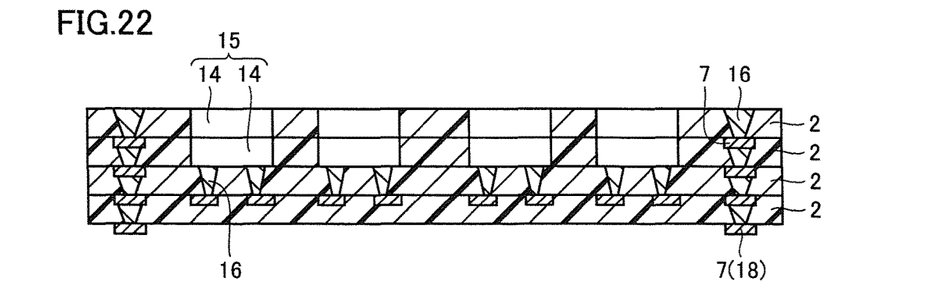
FIG. 22 is an explanatory view of an eighth step of the method for manufacturing the resin multilayer substrate in accordance with the present invention.

As step S3, the plurality of resin layers 2 are laminated to form a substrate, as shown in FIG. 22. In the lowermost layer of the substrate, resin layer 2 is disposed with its surface having conductor pattern 7 formed thereon facing downward, such that conductor pattern 7 is disposed on a lower surface of the substrate. Thereby, conductor pattern 7 disposed on the lower surface of the substrate serves as an external electrode 18. In the vicinity of the lower surface of the substrate, resin layer 2 not having through hole 14 formed therein is used.

After one resin layer 2 not having through hole 14 formed therein is disposed, or two or more resin layers 2 not having through hole 14 formed therein are laminated, resin layer 2 having through hole 14 formed therein is laminated. In the example shown in FIG. 22, two resin layers 2 not having through hole 14 formed therein are disposed, and thereafter two resin layers 2 having through hole 14 formed therein are overlapped. Here, a component accommodating part 15 as a cavity is formed by combining through holes 14 in two or more layers. Component accommodating part 15 is a concave part having a depth enough to accommodate built-in component 4a. For example, when built-in component 4a has a thickness identical to the thickness of one resin layer 2, component accommodating part 15 may be formed of through hole 14 in only one resin layer 2.

Once resin layers 2 are laminated to form component accommodating part 15 as shown in FIG. 22, temporary compression bonding is performed at a temperature lower than the thermal compression bonding temperature. The temperature for the temporary compression bonding is, for example, more than or equal to 150° C. and less than or equal to 200° C. By performing the temporary compression bonding, resin layers 2 laminated so far are bonded, and component accommodating part 15 is formed as a stable concave part. The temporary compression bonding may be performed every time one resin layer is laminated.

Figure 23:
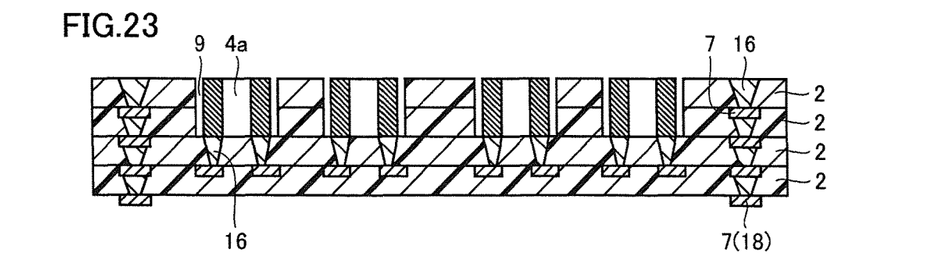
FIG. 23 is an explanatory view of a ninth step of the method for manufacturing the resin multilayer substrate in accordance with the present invention.

As step S4, built-in component 4a is disposed within component accommodating part 15, as shown in FIG. 23. In the example shown herein, built-in component 4a is a rectangular parallelepiped, and has electrodes at both ends in the longitudinal direction. However, the shape and the structure of built-in component 4a are not limited thereto. At this moment, there may be a gap 9 around built-in component 4a.

Figure 24:
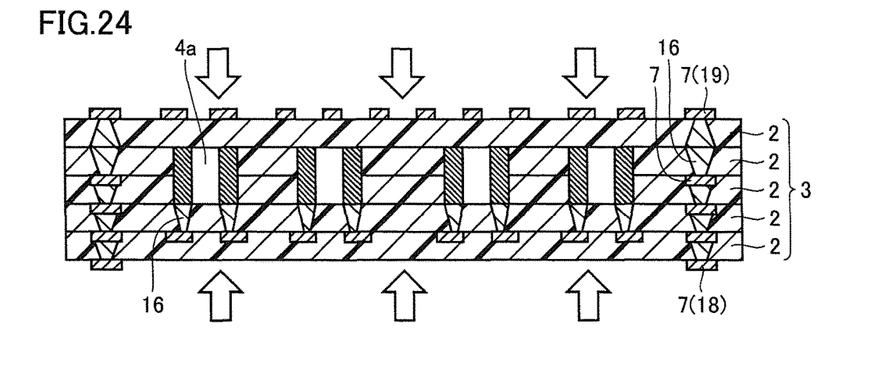
FIG. 24 is an explanatory view of a tenth step of the method for manufacturing the resin multilayer substrate in accordance with the present invention.

Next, as shown in FIG. 24, another resin layer 2 is disposed above built-in component 3. This resin layer 2 does not have through hole 14 formed therein. Conductor pattern 7 formed on resin layer 2 located in the uppermost layer of the substrate serves as an external electrode 19 for mounting another IC component or the like. Although only one resin layer 2 is overlapped in the example shown in FIG. 24 as compared with FIG. 23, not only one resin layer 2 but also two or more resin layers 2 may be overlapped.

Next, as step S5, permanent compression bonding is performed on this laminate. In the step of performing the permanent compression bonding, a laminate which has already been temporarily compression bonded and resin layer 2 laminated after the temporary compression bonding are thermally compression bonded all together. The temperature for the permanent compression bonding is, for example, more than or equal to 250° C. and less than or equal to 300° C. The "thermal compression bonding temperature" described above means the temperature for the permanent compression bonding. By performing the permanent compression bonding, resin layers 2 adjacent in the thickness direction are bonded to each other to form an integrated insulating base material. When the material for resin layer 2 is a thermoplastic resin, the material for resin layer 2 is softened and fluidized by the thermal compression bonding. Accordingly, gap 9 is filled with the fluidized material for resin layer 2 in the vicinity thereof. The integrated member obtained from the laminate of resin layers 2 by the permanent compression bonding is also referred to as resin structure 3. After the permanent compression bonding is finished, plating with Ni, Au, or the like is preferably performed on surfaces of external electrodes 18, 19 formed on an upper surface and a lower surface of the resin multilayer substrate.

Figure 25:
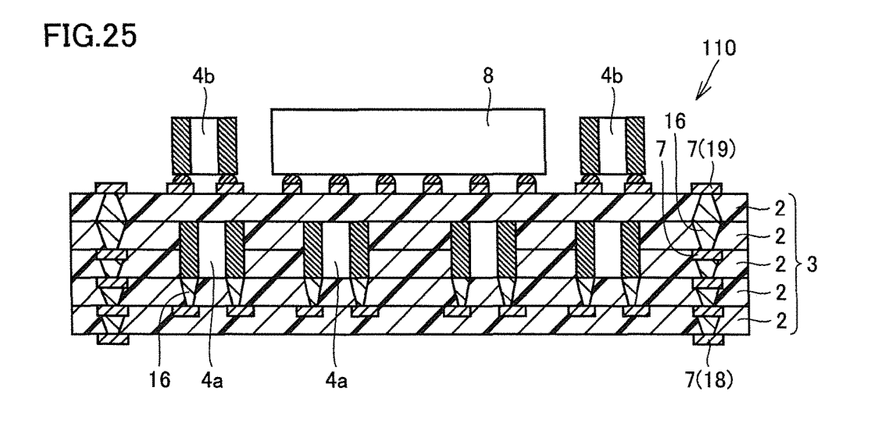
FIG. 25 is an explanatory view of an eleventh step of the method for manufacturing the resin multilayer substrate in accordance with the present invention.

Further, component 8 and mounted component 4b are mounted on an upper surface of resin structure 3. Thereby, resin multilayer substrate 110 is obtained as shown in FIG. 25. Since FIG. 25 is a cross sectional view, FIG. 25 shows four built-in components 4a as if they are simply arranged side by side. However, when built-in components 4a are viewed in a plan view, they are arranged in the positional relation as shown in FIGS. 3, 5, 6, 8, 9, or the like.

The resin multilayer substrate described in each of the above embodiments can be obtained by the manufacturing method as described above. When an attempt is made to manufacture a resin multilayer substrate having no mounted component in its final form, it is only necessary to omit the last step of mounting a mounted component. When an attempt is made to manufacture a resin multilayer substrate having no built-in component in its final form, it is only necessary to omit an intermediate step of disposing a built-in component.

In each of the embodiments disclosed herein, disposed component 4 is a rectangular parallelepiped, and electrodes of disposed component 4 are provided at both end portions of the rectangular parallelepiped. However, the shape of the electrodes is not limited thereto, and a plurality of electrodes may be provided as in an LGA (Land Grid Array) or an IC.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The present invention is applicable to a resin multilayer substrate.

REFERENCE SIGNS LIST

2: resin layer; 3: resin structure; 4, 411, 412, 421, 422: disposed component; 4a: built-in component; 4b: mounted component; 5: boundary line; 6: axis (in a direction perpendicular to a bending moment generated at each position when the flexible part is bent); 7: conductor pattern; 8: component; 9: gap; 11: via hole; 12: conductor foil-attached resin sheet; 13: resist pattern; 14: through hole; 15: component accommodating part; 16: via conductor; 17: conductor foil; 18, 19: external electrode; 21: flexible part; 22: rigid part; 91a, 91b: arrow; 101, 101i, 101j, 102, 103, 110: resin multilayer substrate.

The invention claimed is:

1. A resin multilayer substrate, comprising:
   a resin structure comprising a plurality of laminated resin layers; and
   one or more disposed components, each one of the disposed components being a built-in component embedded within said resin structure or a mounted component mounted on a surface of said resin structure,
   wherein said resin structure includes a flexible part in which a first lamination number of said resin layers are laminated, and a rigid part in which a second lamination number of said resin layers are laminated, said rigid part being less flexible than said flexible part, said second lamination number being larger than said first lamination number, and
   when viewed in a direction perpendicular to the surface of said resin structure, an angle between an imaginary center line parallel to two straight outer edges of said rigid part and a boundary line between said flexible part and said rigid part is other than a right angle, the two straight outer edges extend an entire length of the rigid part, and, among said one or more disposed components, a disposed component which is closest to said boundary line is disposed such that a side of the disposed component which is closest to said boundary line is parallel to said boundary line.

2. The resin multilayer substrate according to claim 1, wherein, when viewed in a direction perpendicular to the surface of said resin structure, among said one or more disposed components, said disposed component which is closest to said boundary line between said flexible part and said rigid part is a rectangle, and is disposed such that a long side of said rectangle is parallel to said boundary line.

3. The resin multilayer substrate according to claim 1, wherein, when viewed in a direction perpendicular to the surface of said resin structure, among said one or more disposed components, said disposed component whose distance to said boundary line is shorter than a distance of said disposed component to an outline of said resin structure has a shape having a longitudinal direction, and is disposed such that said longitudinal direction extends along said boundary line.

4. The resin multilayer substrate according to claim 1, wherein, when viewed in a direction perpendicular to the surface of said resin structure, among said one or more disposed components, said disposed component disposed in said flexible part has a shape having a longitudinal direction, and is disposed such that said longitudinal direction extends along an axis in a direction perpendicular to a bending moment generated at each position when said flexible part is bent.

5. The resin multilayer substrate according to claim 1, wherein said one or more disposed components include two disposed components as a first group disposed at a first height of the resin multilayer substrate in a lamination direction and further two disposed components as a second group disposed at a second height of the resin multilayer substrate, said second height is different from said first height, said second height is closer to an inner circumference of the flexible part than said first height is when said flexible part is bent, and an interval between the two disposed components as said second group is longer than an interval between the two disposed components as said first group.

6. The resin multilayer substrate according to claim 2, wherein, when viewed in a direction perpendicular to the surface of said resin structure, among said one or more disposed components, said disposed component whose distance to said boundary line is shorter than a distance of said disposed component to an outline of said resin structure has a shape having a longitudinal direction, and is disposed such that said longitudinal direction extends along said boundary line.

7. The resin multilayer substrate according to claim 2, wherein, when viewed in a direction perpendicular to the surface of said resin structure, among said one or more disposed components, said disposed component disposed in said flexible part has a shape having a longitudinal direction, and is disposed such that said longitudinal direction extends along an axis in a direction perpendicular to a bending moment generated at each position when said flexible part is bent.

8. The resin multilayer substrate according to claim 2, wherein said one or more disposed components include two disposed components as a first group disposed at a first height of the resin multilayer substrate in a lamination direction and further two disposed components as a second group disposed at a second height of the resin multilayer substrate, said second height is different from said first height, said second height is closer to an inner circumference of the flexible part than said first height is when said flexible part is bent, and an interval between the two disposed components as said second group is longer than an interval between the two disposed components as said first group.

9. The resin multilayer substrate according to claim 3, wherein said one or more disposed components include two disposed components as a first group disposed at a first height of the resin multilayer substrate in a lamination direction and further two disposed components as a second group disposed at a second height of the resin multilayer substrate, said second height is different from said first height, said second height is closer to an inner circumference of the flexible part than said first height is when said flexible part is bent, and an interval between the two disposed components as said second group is longer than an interval between the two disposed components as said first group.

10. The resin multilayer substrate according to claim 4, wherein said one or more disposed components include two disposed components as a first group disposed at a first height of the resin multilayer substrate in a lamination direction and further two disposed components as a second group disposed at a second height of the resin multilayer substrate, said second height is different from said first height, said second height is closer to an inner circumference of the flexible part than said first height is when said flexible part is bent, and an interval between the two disposed components as said second group is longer than an interval between the two disposed components as said first group.

* * * * *

UNITED STATES PATENT AND TRADEMARK OFFICE
CERTIFICATE OF CORRECTION

PATENT NO. : 10,080,280 B2
APPLICATION NO. : 15/678422
DATED : September 18, 2018
INVENTOR(S) : Norio Sakai Page 1 of 1

It is certified that error appears in the above-identified patent and that said Letters Patent is hereby corrected as shown below:

On the Title Page

On page 2 item [56], under Related U.S. Application Data, "PCT/JP2013/054126" should read --PCT/JP2013/054128--.

Signed and Sealed this
Twelfth Day of February, 2019

Andrei Iancu
*Director of the United States Patent and Trademark Office*